US012610570B2

(12) United States Patent
Mazzillo et al.

(10) Patent No.: US 12,610,570 B2
(45) Date of Patent: Apr. 21, 2026

(54) SEMICONDUCTOR PRODUCT AND METHOD FOR PRODUCING A SEMICONDUCTOR PRODUCT

(71) Applicant: NEXPERIA B.V., Nijmegen (NL)

(72) Inventors: Massimo Cataldo Mazzillo, Hamburg (DE); Sönke Habenicht, Hamburg (DE); Joachim Stache, Nijmegen (NL); Wolfgang Schnitt, Hamburg (DE); Jesus Roberto Urresti Ibanez, Hamburg (DE)

(73) Assignee: Nexperia B.V., Nijmegen (NL)

( * ) Notice: Subject to any disclaimer, the term of this patent is extended or adjusted under 35 U.S.C. 154(b) by 442 days.

(21) Appl. No.: 18/180,445

(22) Filed: Mar. 8, 2023

(65) Prior Publication Data

US 2023/0290889 A1      Sep. 14, 2023

(30) Foreign Application Priority Data

Mar. 9, 2022      (EP) ..................................... 22161020

(51) Int. Cl.
| | |
|---|---|
| *H10D 8/60* | (2025.01) |
| *H10D 8/01* | (2025.01) |
| *H10D 62/10* | (2025.01) |
| *H10D 62/832* | (2025.01) |

(52) U.S. Cl.
CPC .............. *H10D 8/60* (2025.01); *H10D 8/051* (2025.01); *H10D 62/126* (2025.01); *H10D 62/8325* (2025.01)

(58) Field of Classification Search
CPC ........ H10D 8/051; H10D 8/60; H10D 62/126; H10D 62/8325; H10D 62/106; H10D 62/124

USPC .......................................................... 257/77
See application file for complete search history.

(56) References Cited

U.S. PATENT DOCUMENTS

2018/0212071 A1*      7/2018      Mihaila .............. H10D 62/8325

OTHER PUBLICATIONS

R. Rupp et al. "Avalanche Behaviour and its Temperature Dependence of Commercial SiC MPS Diodes: Influence of Design and Voltage Class", Proceedings of the 26th International Symposium on Power Semiconductor Devices & IC's, pp. 67-70, Jun. 15-19, 2014, Hawaii, IEEE.

* cited by examiner

*Primary Examiner* — Monica D Harrison
(74) *Attorney, Agent, or Firm* — Ruggiero McAllister & McMahon LLC

(57)      ABSTRACT

A semiconductor product, including: a base region doped with a first conductivity type; a plurality of stripe regions doped with a second conductivity type, provided on an upper surface of the base region, and the second conductivity type is different from the first conductivity type; a plurality of cell regions doped with the second conductivity type, provided on the upper surface of the base region; and a metal layer arranged on the upper surface of the base region, so that the metal layer defines a Schottky barrier with the base region and covers the plurality of stripe regions and the plurality of cell regions; and each cell region of a majority of the plurality of cell regions contacts at least one neighboring stripe region of the plurality of stripe regions and the stripe regions and the cell regions extend into the base region to different depths.

19 Claims, 14 Drawing Sheets

40

SEMICONDUCTOR PRODUCT AND METHOD FOR PRODUCING A SEMICONDUCTOR PRODUCT

CROSS-REFERENCE TO RELATED APPLICATIONS

This application claims the benefit under 35 U.S.C. § 119(a) of European Application No. 22161020.7 filed Mar. 9, 2022, the contents of which are incorporated by reference herein in their entirety.

BACKGROUND

1. Field of the Disclosure

The present disclosure generally relates to semiconductor products. Particular embodiments relate to a semiconductor product, a mask for producing a semiconductor product, a method for producing a semiconductor product, and a computer program.

2. Description of the Related Art

Silicon Carbide (SiC) Merged PiN Schottky (MPS) diodes show great potential for switching power supply applications. A SiC MPS diode conventionally comprises Schottky and P+ implanted areas in an N-type epitaxial wafer. The reliability of silicon carbide (SiC) devices deserves great attention from device designers in consideration of the fact that SiC devices are usually designed to operate at high voltage/current conditions. Surge current capability, which represents the reliability of power devices under high current pulses, is one of the key parameters for device ruggedness since high current pulses are common at the starting-up of electrical equipment or during accidental circuit failures.

SiC MPS diodes combine the advantages of a low forward voltage drop at nominal current and a high surge current capability. During the surge event, huge heat can be generated and dissipated within the device, thus leading to an increase of the junction temperature and eventually device failure, due typically to aluminium pad melting. Therefore, the main point to improve the surge capability of the MPS diodes is to limit the junction temperature rising. This could be achieved by optimizing manufacturing process, structure and layout designs to lower the forward voltage drop during the surge process, and hence to reduce the generated heat.

The physical mechanism of the surge phenomenon and the device design methodology to improve the surge capability remain as some of the main research topics about SiC MPS diodes. Most of the diodes available off-the-shelf or disclosed in the literature exhibit poor or quite limited surge current capability performance.

An example of a prior art SiC MPS diode is presented in FIG. 1 (prior art), and is referenced from R. Rupp et al., Proceedings of the 26th International Symposium on Power Semiconductor Devices & IC's, 2014, Hawaii. In this figure, the grey "solid" hexagons are P cell regions and the honeycomb framework defines P stripe regions, embedded in an N region. The wide area at the right is a termination area of the diode. The area to the left, containing the hexagons and the honeycomb framework is the active area. Diodes with this layout are recognized as having state of the art surge current capability performance. The FIG. 1 shows in a top-plan view in the X,Y,Z reference system an example where Schottky diodes (the dark "empty" hexagons) and PN junctions (grey "solid" hexagons) are in the form of cells or dots with an hexagonal shape. In particular, each PN junction element (or equivalently each P+ island) is completely surrounded on all the six sides of the cell by a respective Schottky diode. Moreover, each Schottky diode is completely surrounded (in top plan view) and separated from an adjacent Schottky diode by a P+ region. The proposed design uses hexagons of different size. The distance between opposite sides in the bigger hexagons is in the range 6 um-8 um while the distance between opposite sides in smaller hexagons is in the range 3 um-4 um. The bigger hexagons are connected one to each other through thinner (about 1 um wide) P+ stripes having a honeycomb framework shape with a width of approximately 1 um. The smaller hexagons are completely isolated from other P+ doped regions by Schottky diodes.

SUMMARY

It is an aim of at least some embodiments according to the present disclosure to enhance the IFSM (Forward Surge Current Capability) performance.

Accordingly, there is provided in a first aspect of the present disclosure a semiconductor product. The semiconductor product comprises the following elements. A base region doped with a first conductivity type. A plurality of stripe regions doped with a second conductivity type, provided on an upper surface of the base region, wherein the second conductivity type is different from the first conductivity type. A plurality of cell regions doped with the second conductivity type, provided on the upper surface of the base region. A metal layer arranged on the upper surface of the base region, such that the metal layer defines a Schottky barrier with the base region and covers the plurality of stripe regions and the plurality of cell regions. Each cell region of a majority of the plurality of cell regions contacts at least one neighboring stripe region of the plurality of stripe regions.

The semiconductor product according to the present disclosure is based at least in part on the insight of the inventors that having each cell region of a majority of the plurality of cell regions contact at least one neighboring stripe region of the plurality of stripe regions enhances IFSM (Forward Surge Current Capability) performance of the semiconductor product. This is because the relatively large-area cell regions increase the area of PN-junction and therefore increase the uniformity of the Schottky current distribution in their neighborhood, allowing their activation at the lowest possible forward voltage value (due to the current effect), whereas the stripe regions act as current spread layers, which are thinner stripes in order to compensate the reduction of the Schottky area (with a consequent increase of the voltage drop), due to the partial pinch-off of the Schottky channels caused by the depleted region around the cell and stripe regions. The creation of a large region doped with the second conductivity type, generated by shorting the single cell regions improves the functionality of the PN junction in increasing the bipolar current flow in the surge regime. The higher uniformity of the Schottky current distribution around the relatively larger-area cell regions is such to activate them at an early voltage, thus increasing the surge current capability of the diode.

In other words, a majority or even all of the cell regions contact at least one neighbouring stripe region. The word "majority" may in this context be taken to mean at least half, preferably at least two thirds, or more preferably essentially all. In this context, "essentially all" may be taken to mean all or nearly all relevant elements in an active area of the semiconductor device but excluding elements in or near a termination area of the semiconductor device. Note that said elements in or near the termination area may simply be neglected, even if they could in principle comply with the condition.

In this context, a stripe region may be taken to mean a region that is an elongated narrow section differing in material from adjoining parts, in particular from the base region onto which it is provided.

Preferably, the plurality of stripe regions may be inter-digitated in the sense conventionally used in the relevant literature, that is, as alternating elongated sections. In some embodiments according to the present disclosure, the stripe regions do not need to be parallel—for their suitable opera-tion in the context of the present disclosure, the relevant parameters characterizing the stripe regions are their indi-vidual widths and their mutual distances from each other. Of course, it is preferred to have mutually parallel stripe regions, as this is more easily implemented and as there is believed to be little or no benefit to other arrangements than mutually parallel stripe regions.

It is noted that the metal layer is arranged on the upper surface of the base region, such that the metal layer defines a Schottky barrier with the base region and covers the plurality of stripe regions and the plurality of cell regions. In other words, the metal layer forms a conductive superstrate for the plurality of stripe regions and the plurality of cell regions, ensuring that these can be electrically shorted. In some embodiments, the metal layer may have a different metal composition at different locations, for example a first metal composition atop the part of the upper surface of the base region that is exposed to the metal layer and a second, different, metal composition atop the stripe regions and the cell regions. Of course, alternatively, a uniform metal com-position may be used.

In some embodiments, each cell region of the majority of the plurality of cell regions contacts at least two neighboring stripe regions of the plurality of stripe regions.

In some embodiments, each cell region of the plurality of cell regions contacts at least one neighboring stripe region of the plurality of stripe regions.

In some embodiments, each cell region of the plurality of cell regions contacts at least two neighboring stripe regions of the plurality of stripe regions.

In some embodiments, individual cell regions of the plurality of cell regions are aligned with at least some other cell regions of the plurality of cell regions.

In some embodiments, individual cell regions of the plurality of cell regions are staggered with at least some other cell regions of the plurality of cell regions.

In this context, being staggered may be taken to mean being arranged in any of various zigzags, alternations, or overlapping of position.

In some embodiments, the plurality of stripe regions extends from one end of the semiconductor product to another end of the semiconductor product.

In some embodiments, respective depths to which the plurality of stripe regions and the plurality of cell regions extend into the base region are different.

In some embodiments, the semiconductor product is a Merged Pin Schottky, MPS, silicon carbide, SiC, diode. Of course, the principles underlying the embodiments accord-ing to the present disclosure are applicable to all kinds of MPS diodes manufactured with other semiconductor mate-rials.

In some embodiments, the base region is n-doped; and wherein the plurality of stripe regions and the plurality of cell regions is p-doped.

Additionally, there is provided in a second aspect of the present disclosure a mask for producing a semiconductor product according to any one of the above-described embodiments.

The skilled person will understand that features and considerations applying to embodiments of the semiconduc-tor product according to the present disclosure may also apply, mutatis mutandis, to embodiments of the mask according to the present disclosure.

Additionally, there is provided in a third aspect of the present disclosure a method for producing a semiconductor product. The method comprises the following steps. Arrang-ing a base region doped with a first conductivity type. Providing on an upper surface of the base region a plurality of stripe regions doped with a second conductivity type different from the first conductivity type. Providing on the upper surface of the base region a plurality of cell regions doped with the second conductivity type. Arranging a metal layer on the upper surface of the base region, such that the metal layer defines a Schottky barrier with the base region and covers the plurality of stripe regions and the plurality of cell regions. These steps are performed in such a way, that each cell region of a majority of the plurality of cell regions contacts at least one neighboring stripe region of the plu-rality of stripe regions.

The skilled person will understand that features and considerations applying to embodiments of the semiconduc-tor product according to the present disclosure may also apply, mutatis mutandis, to embodiments of the method according to the present disclosure.

In some embodiments, each cell region of the majority of the plurality of cell regions contacts at least two neighboring stripe regions of the plurality of stripe regions.

In some embodiments, each cell region of the plurality of cell regions contacts at least one neighboring stripe region of the plurality of stripe regions.

In some embodiments, each cell region of the plurality of cell regions contacts at least two neighboring stripe regions of the plurality of stripe regions.

In some embodiments, individual cell regions of the plurality of cell regions are aligned with at least some other cell regions of the plurality of cell regions.

In some embodiments, individual cell regions of the plurality of cell regions are staggered with at least some other cell regions of the plurality of cell regions.

Additionally, there is provided in a fourth aspect of the present disclosure a computer program or computer imple-mented method embodied on a non-transitory computer readable medium comprising instructions configured for, when executed by a processor of a lithographic apparatus, causing the lithographic apparatus to perform the steps of any one of the above-described embodiments of the method according to the present disclosure.

The skilled person will understand that features and considerations applying to embodiments of the semiconduc-tor product according to the present disclosure may also apply, mutatis mutandis, to embodiments of the computer program according to the present disclosure.

BRIEF DESCRIPTION OF DRAWINGS

The disclosure will be more fully understood with the help of the following description, which is given by way of example only, and with reference to the appended drawings, in which.

Figure 1:
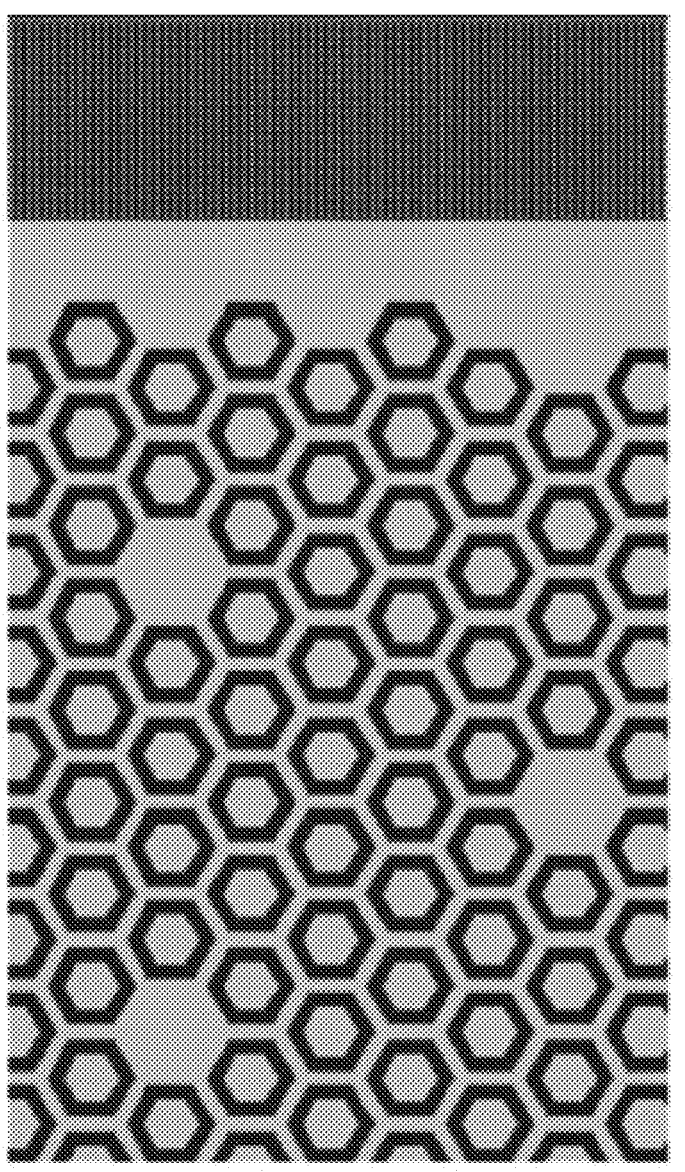
FIG. 1 represents a prior art SiC MPS diode.

In the drawings, embodiments are illustrated by way of example. It is to be expressly understood that the description and drawings are only for the purpose of illustration and as an aid to understanding and are not intended as a definition of the limits of the disclosure. In the figures, like elements may be referred to using like reference numbers.

It will be understood that the exemplary embodiments illustrated in the drawings are schematical and therefore represent only small sized sections of the entire semiconductor product.

DETAILED DESCRIPTION

FIG. 1 represents a prior art SiC MPS diode. This figure has been described above in the background section.

Figure 2:
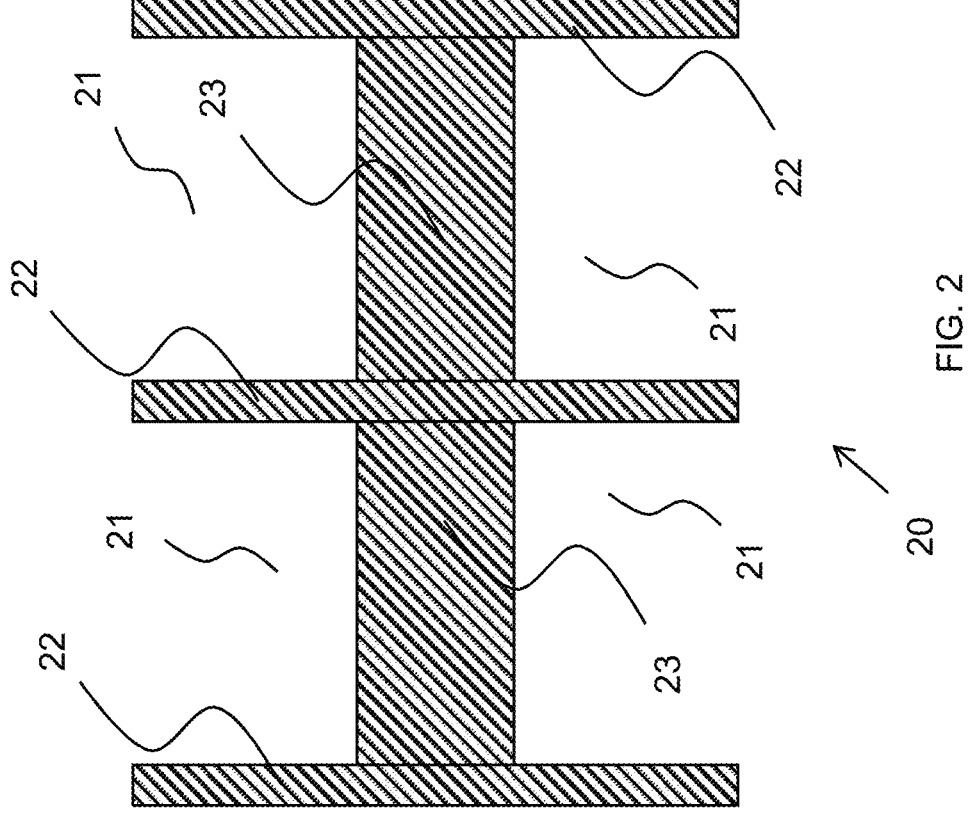
FIG. 2 schematically represents a top-plan view of an exemplary embodiment 20 of a semiconductor product according to the present disclosure.

FIG. 2 schematically represents a top-plan view of an exemplary embodiment 20 of a semiconductor product according to the present disclosure.

The semiconductor product 20 comprises the following elements: a base region 21, a plurality of stripe regions 22, and a plurality of cell regions 23. Additionally, a metal layer is present, which is not shown in this figure, but which is clearly indicated in related FIG. 3.

The base region 31 is doped with a first conductivity type, preferably n-doped, i.e. doped with pentavalent donor atoms. It is noted that the notation n-doped is intended to be the same as N-doped or simply N.

The plurality of stripe regions 22 has been doped with a second conductivity type, preferably p-doped, i.e. doped with trivalent acceptor atoms. It is noted that the notation p-doped is intended to be the same as P-doped or simply P. The plurality of stripe regions 22 is provided on an upper surface of the base region 21 (in this top-plan view, the upper surface of the base region 21 coincides with the plane of the paper). The second conductivity type is different from the first conductivity type.

The plurality of cell regions 23 has been doped with the second conductivity type, and is provided on the upper surface of the base region.

The metal layer (not shown) is arranged on the upper surface of the base region 21, such that the metal layer defines a Schottky barrier with the base region 21 and covers the plurality of stripe regions 22 and the plurality of cell regions 23.

Each cell region 23 of a majority of the plurality of cell regions 23 contacts at least one neighbouring stripe region 22 of the plurality of stripe regions 22. In other words, the cell regions 23 are not surrounded only by the base region 21, but by the base region 21 and by stripe regions 22. This is different from the prior art diode shown in FIG. 1, because in the prior art diode, most of the P islands are surrounded by Schottky areas and therefore do not contact the honeycomb framework.

The figure also shows that, in this particular example, each cell region 23 of the majority of the plurality of cell regions 23 may contact at least two neighbouring stripe regions 22 of the plurality of stripe regions 22. Obviously, some individual stripe regions 22, e.g. in this figure the middle one, may be contacted by two distinct cell regions 23, and other individual stripe regions 22, e.g. in this figure the two at the sides, may be contacted by one single cell region 23.

The figure also shows that, in this particular example, each cell region 23 of the plurality of cell regions 23 may contact at least one neighbouring stripe region 22 of the plurality of stripe regions 22. In other words, in embodiments like this one, it may be the case that there are no cell regions that do not contact any stripe region.

The figure also shows that, in this particular example, each cell region 23 of the plurality of cell regions 23 may contact at least two neighbouring stripe regions 22 of the plurality of stripe regions 22. An example further development wherein four stripe regions are contacted will be described below with reference to FIG. 8.

The figure also shows that, in this particular example, individual cell regions 23 of the plurality of cell regions 23 may be aligned with at least some other cell regions 23 of the plurality of cell regions 23, in this particular case even with all other cell regions 23.

It is noted that one cell region per pair of stripe regions may in principle suffice, but that multiple cell regions may be used to improve uniform behaviour of current spreading. It is also noted that random interspersion of cell regions amidst stripe regions is in principle possible, but is not believed to provide any advantage over pre-determined arrangement of cell regions.

Another way to look at the embodiment according to the present disclosure as shown in FIG. 2 is as follows: a plurality of cell regions 23 are connected one to each other at their respective sides, having interdigitated stripe regions 22 in between them. In other words, in this configuration, the cells regions may not be surrounded on all their sides by Schottky channels. This may be effective from a physical point of view, as connecting multiple cell regions 23 improves the effect.

Figure 3:
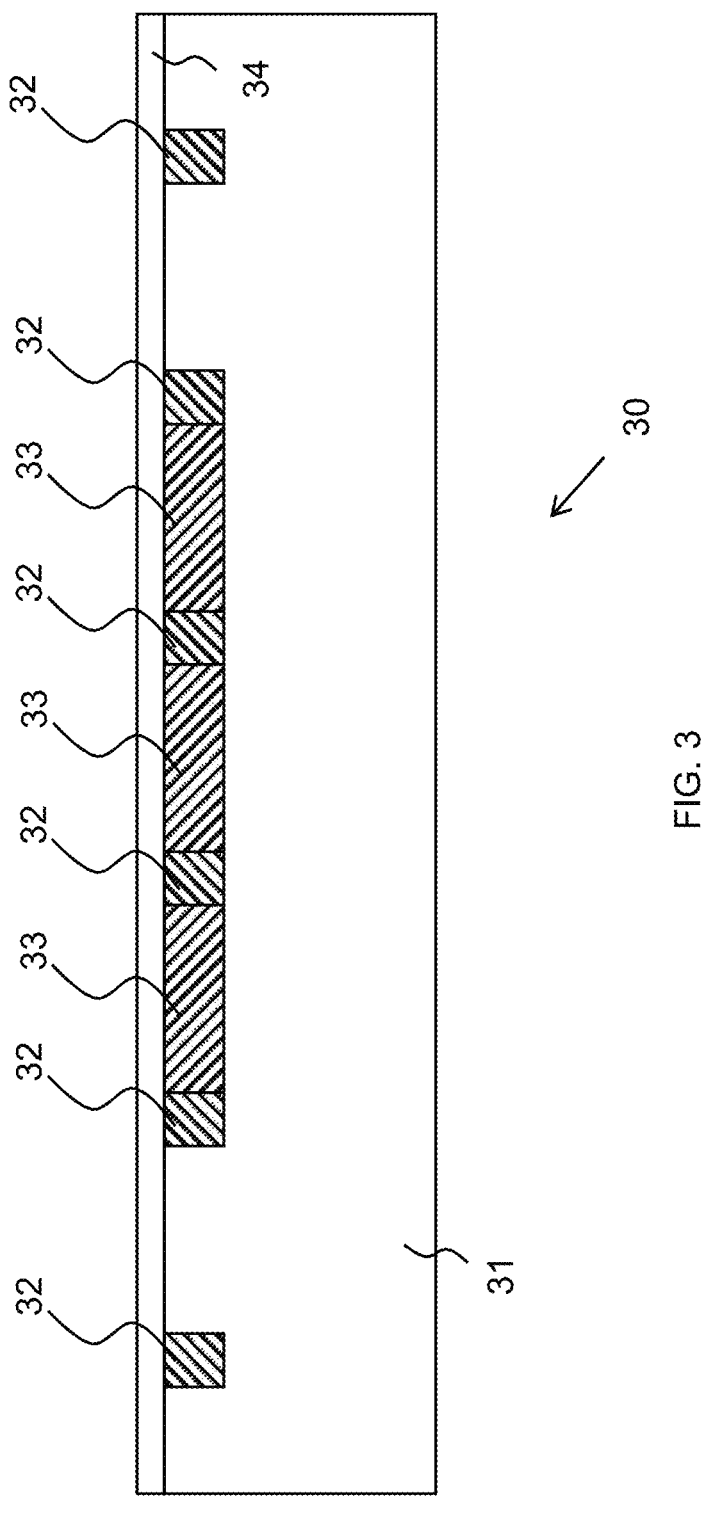
FIG. 3 schematically represents a cross-sectional view of an exemplary embodiment 30 of a semiconductor product according to the present disclosure, e.g. the exemplary embodiment 20 of FIG. 2.

FIG. 3 schematically represents a cross-sectional view of an exemplary embodiment 30 of a semiconductor product according to the present disclosure, e.g. the exemplary embodiment 20 of FIG. 2. As was noted before, like elements are referred to using like reference numbers. Therefore, in the present disclosure, base region 31 of FIG. 3 corresponds with base region 21 of FIG. 2, and likewise the plurality of stripe regions 32 with the plurality of stripe regions 22, the plurality of cell regions 33 with the plurality of cell regions 23, and similarly for the following figures described below. The figure shows how cell regions 33 adjoin neighbouring stripe regions 32. The figure also shows that there may be some (in fact, there may be many) locations between stripe regions 32 where no cell regions are present. This may either be because, in this cross-sectional view, there is a cell region (not visible) elsewhere than in the cross-sectional plane between the respective two stripe regions 32, or because there exist some stripe regions 32 between which no cell regions are arranged.

FIG. 3 additionally shows the metal layer 34, which is arranged on the upper surface of the base region 21, such that the metal layer 34 defines a Schottky barrier with the base region 31 and covers the plurality of stripe regions 32 and the plurality of cell regions 33. In order to fully cover the base region 31 and the stripe regions 32 and the cell regions 33, it is preferred that their respective upper surfaces are flush with each other. Nevertheless, even if, due to fabrication circumstances, their respective surfaces would not be perfectly flush with each other, the principles of the present disclosure may still apply.

In this particular example, the respective depths to which the stripe regions 32 and the cell regions 33 extend into the base region 31 are identical, which is currently preferred because it is easier to manufacture, but of course the respective depths may instead be different in other embodiments. Using cell regions 33 extending to different depths than the stripe regions 32 and/or cell regions 33 with higher doping than the stripe regions 32, may advantageously enhance the hole injection into the base region 31 during surge events, thus increasing the IFSM capability. In general, using P type regions 32, 33 with different doping and/or different depths may allow to modulate the hole flow in different areas of the device, thus also limiting or even avoiding current crowding and/or heating effects.

Figure 4:
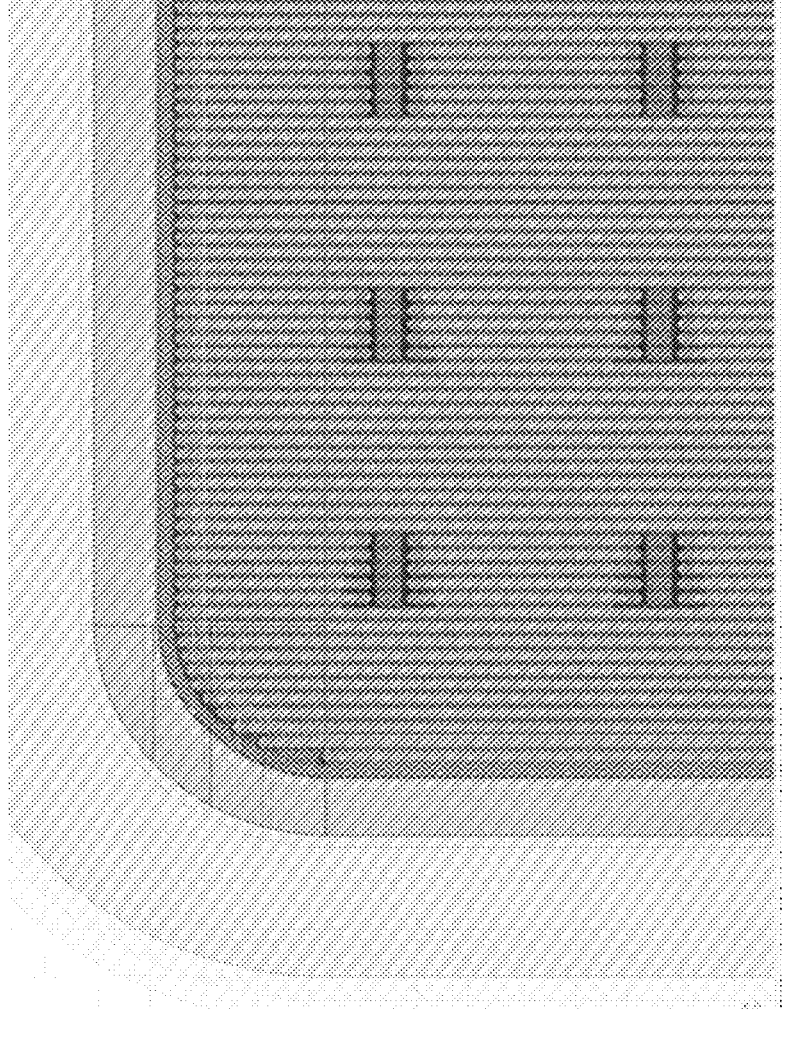
FIG. 4 represents a top-plan view of another exemplary embodiment 40 of a semiconductor product according to the present disclosure.
Figure 5A:
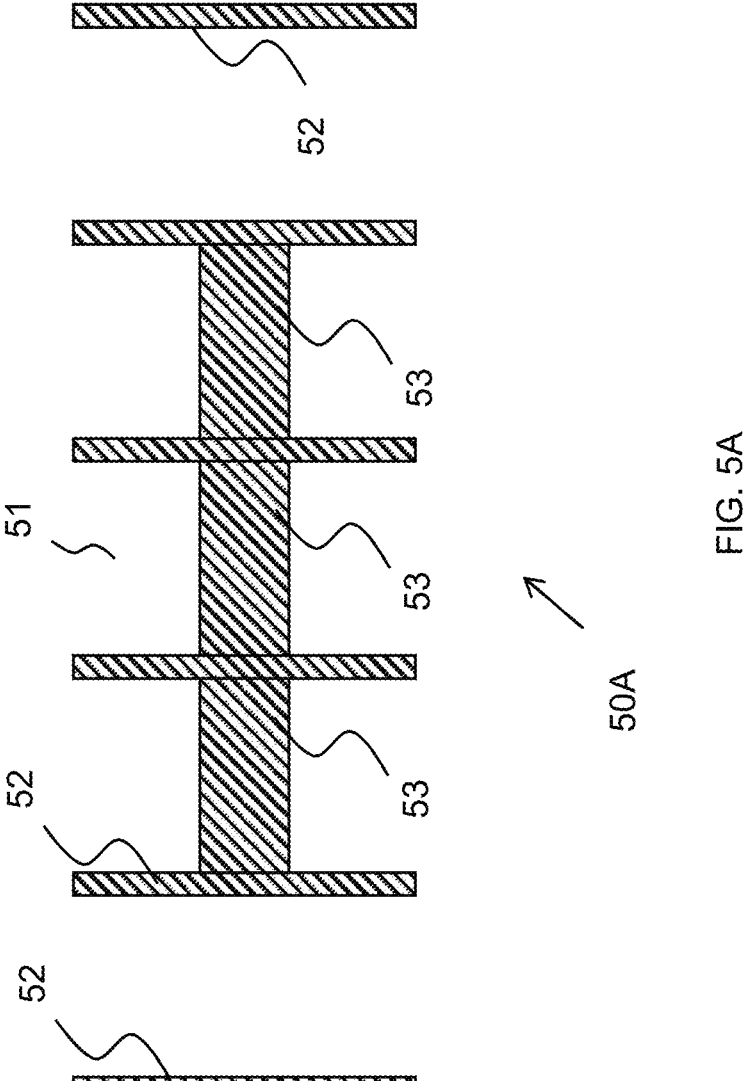
FIGS. 5A, 5B, 5C, 5D, 5E and 5F schematically represent a top-plan view of several exemplary embodiments 50A, 50B, 50C, 50D, 50E, and 50F of a semiconductor product according to the present disclosure.
Figure 5B:
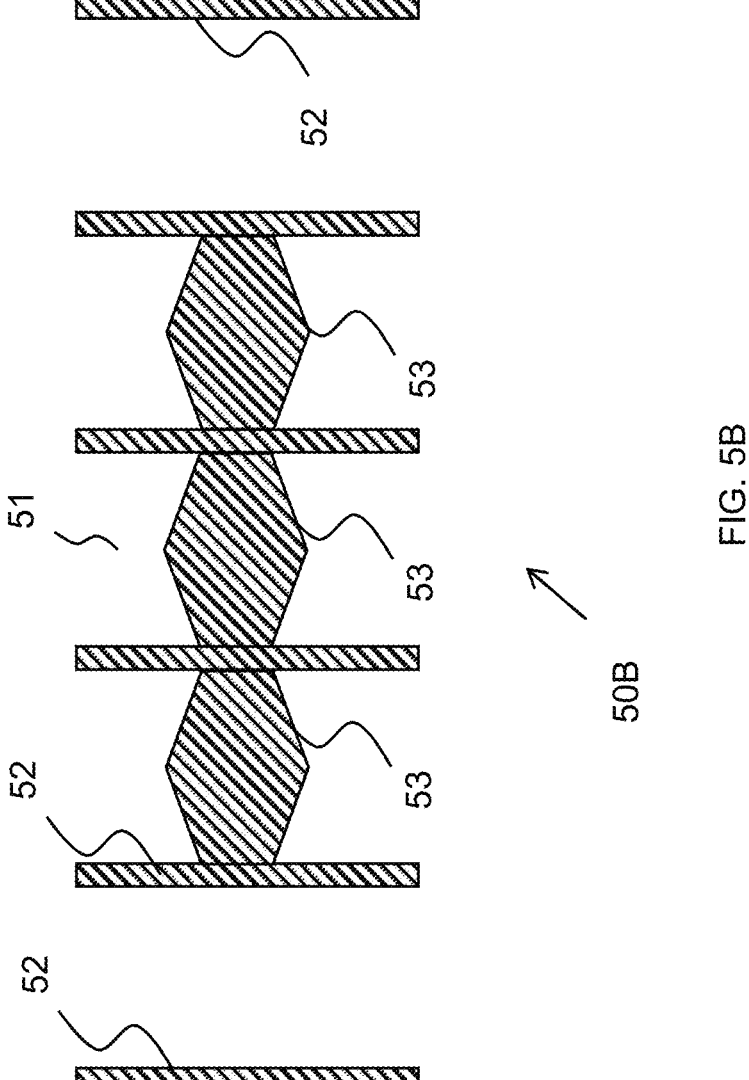
Figure 5C:
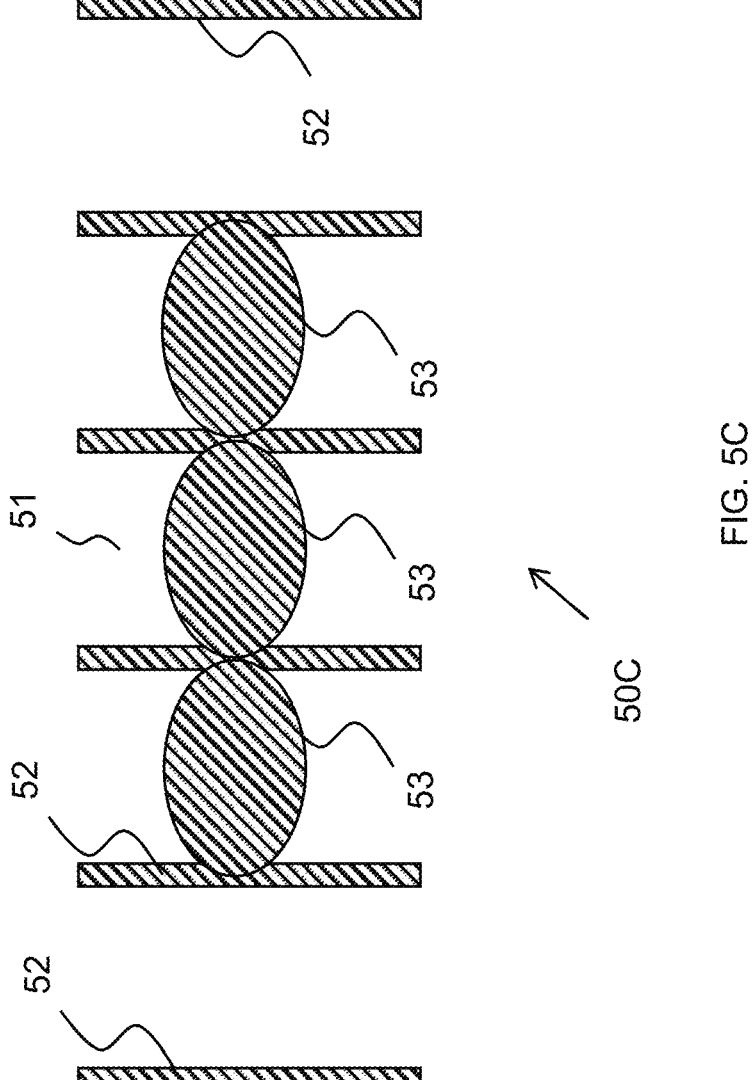
Figure 5D:
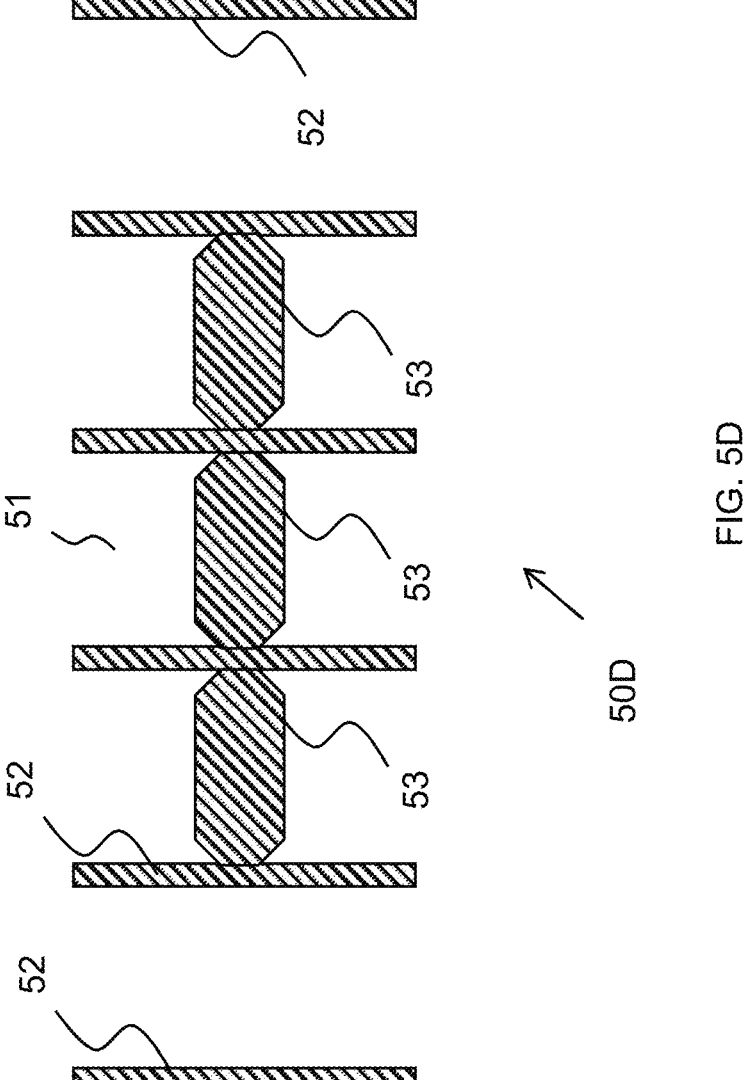
Figure 5E:
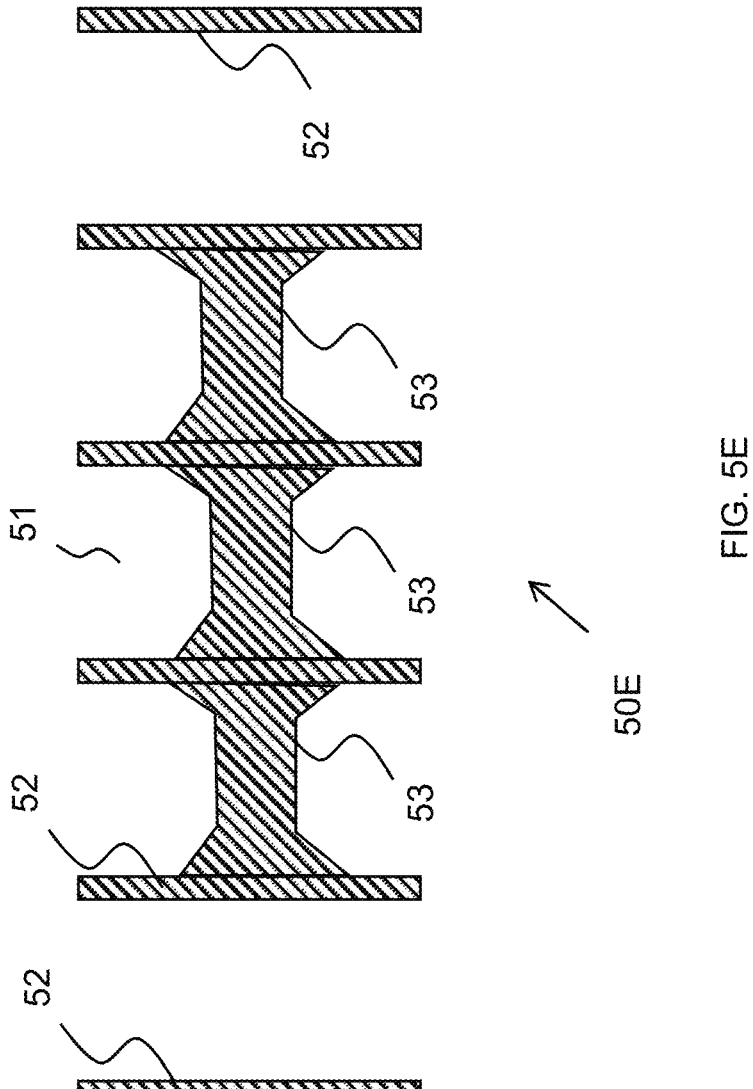
Figure 5F:
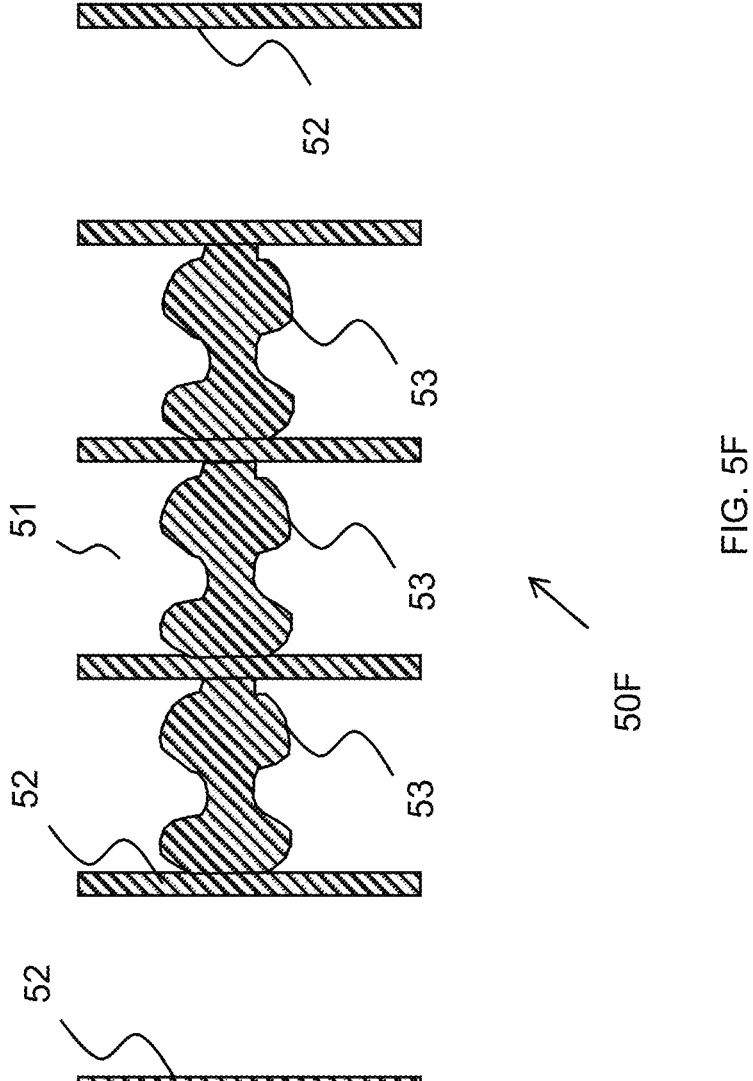

FIG. 4 represents a top-plan view of another exemplary embodiment 40 of a semiconductor product according to the present disclosure. The figure shows a top left corner of a semiconductor product 40, having an active area (the section on the bottom right of the picture, wherein column shapes are visible) and a termination area (the bending contours at the top and left parts of the picture). The column shapes are alternations of a base region and stripe regions provided on an upper surface of the base region. Six clusters are visible in the active are, which are locations where cell regions have been provided on the upper surface of the base region. This particular embodiment 40 clearly illustrates the remark made above that there may exist some stripe regions between which no cell regions are arranged.

This figure shows that the stripe regions may extend from one end of the semiconductor product 40 (in this example, the top part of the picture) to another end (not shown). Of course, in this case, because the stripe regions are straight, the other end is opposite from the one end, but in other embodiments, if the stripe regions are shaped differently, the other end may be another end than the opposite end of the semiconductor product, e.g. an adjacent end.

FIGS. 5A-5F schematically represent a top-plan view of several exemplary embodiments 50A-50F of a semiconductor product according to the present disclosure. FIGS. 5A-5F show further developed embodiments 50A-50F with respect to embodiment 20 of FIG. 2, wherein like elements are referred to using like reference numbers. The remarks made above that there may exist some stripe regions 52 between which no cell regions are arranged is also applicable for the embodiments 50A.

Figure 6:
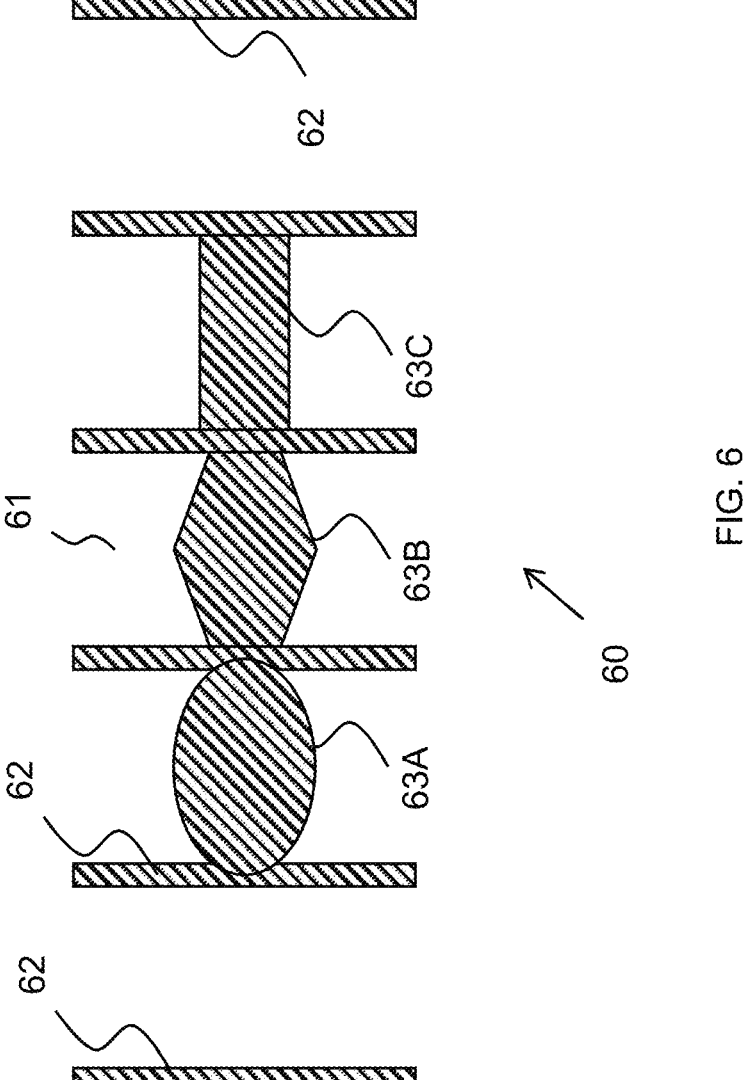
FIG. 6 schematically represents a top-plan view of an exemplary embodiment 60 of a semiconductor product according to the present disclosure.

FIG. 6 schematically represents a top-plan view of an exemplary embodiment 60 of a semiconductor product according to the present disclosure. The exemplary embodiment 60 is similar to exemplary embodiment 50A of FIG. 5A but differs in that some of the cell regions of the plurality of cell regions have different shapes. In this example, cell region 63A is shaped more rounded, cell region 63B is shaped more angular, and cell region 63C is shaped straight as in exemplary embodiment 50A. The skilled person will understand that any combination of differently shaped cell regions may be considered.

Figure 7:
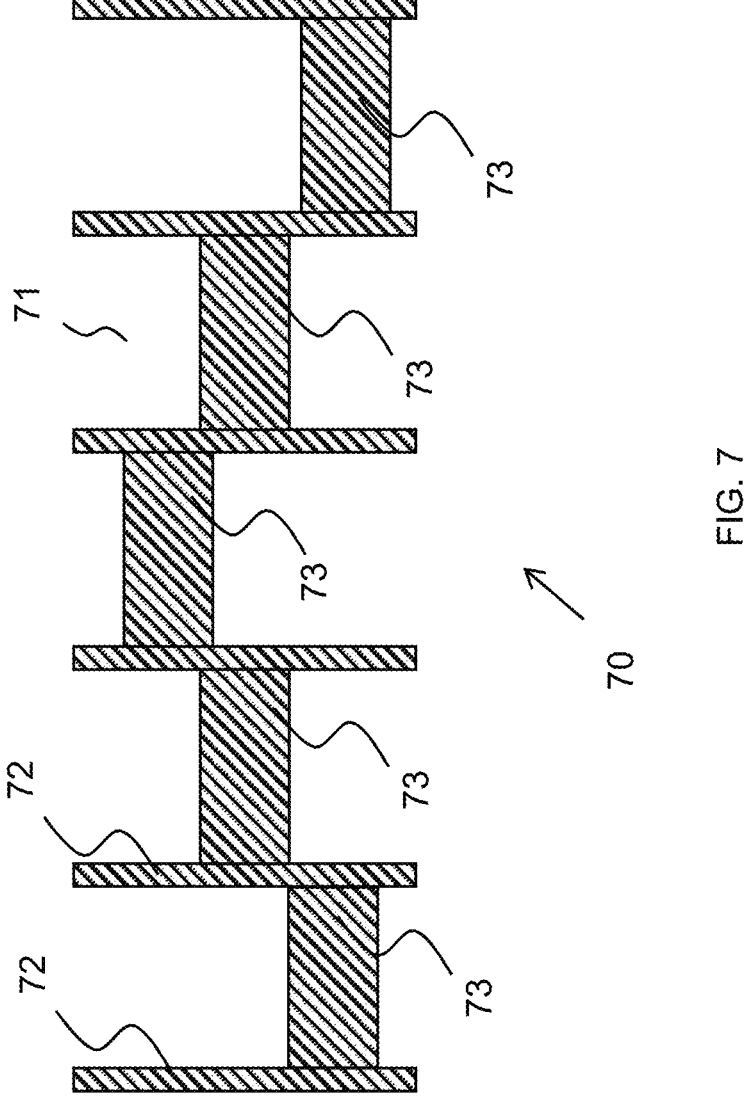
FIG. 7 schematically represents a top-plan view of an exemplary embodiment 70 of a semiconductor product according to the present disclosure.

FIG. 7 schematically represents a top-plan view of an exemplary embodiment 70 of a semiconductor product according to the present disclosure. The exemplary embodiment 70 is similar to exemplary embodiment 50A of FIG. 5A, but differs in that the cell regions 73 are staggered with respect to each other. That is, the cell regions 73 may be arranged in any of various zigzags, alternations, or overlappings of position. In this particular example, they are shown to have an offset distance with respect to their neighbouring cell regions. Of course, the skilled person will understand that any offset pattern and distance may be considered.

Figure 8:
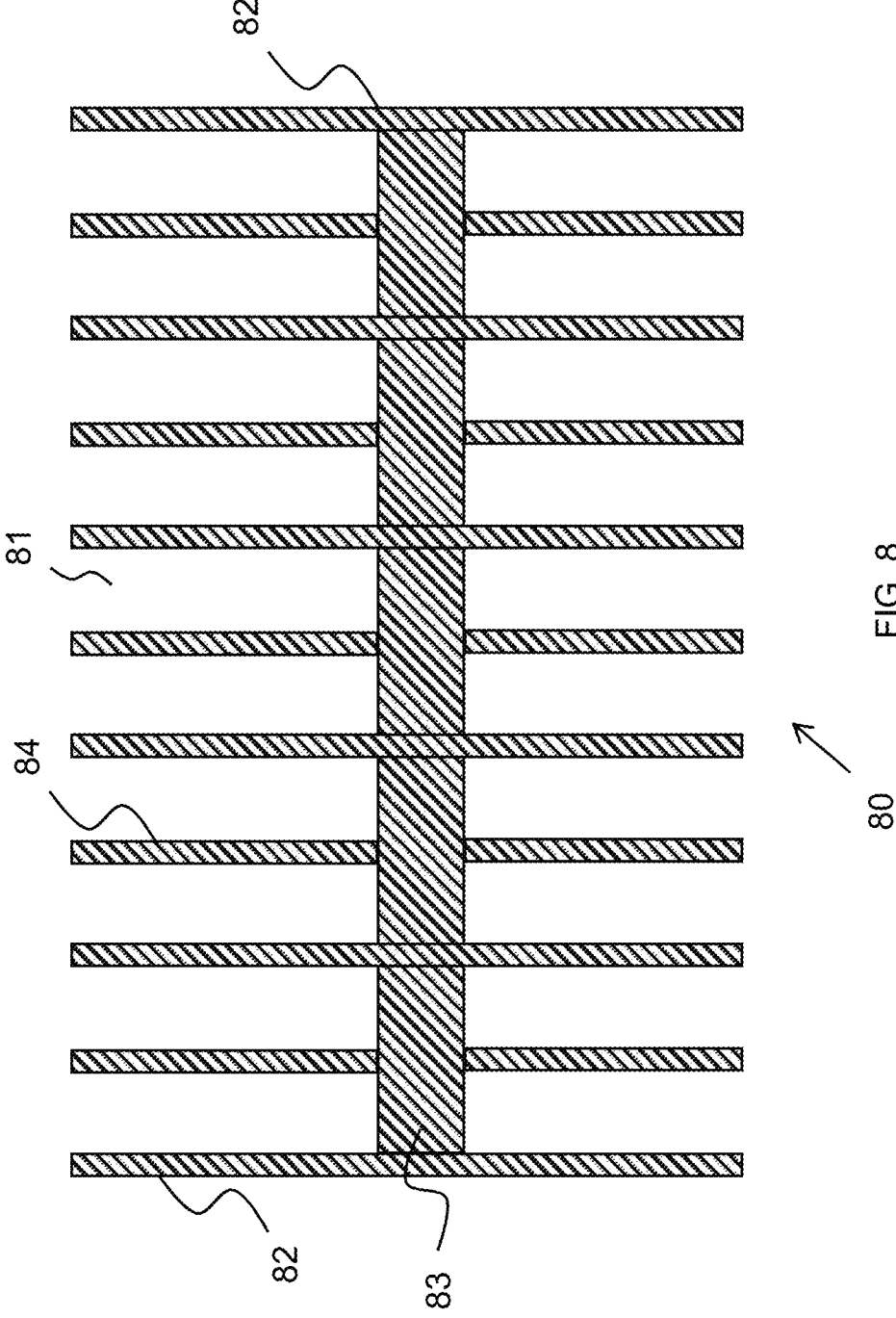
FIG. 8 schematically represents a top-plan view of an exemplary embodiment 80 of a semiconductor product according to the present disclosure.

FIG. 8 schematically represents a top-plan view of an exemplary embodiment 80 of a semiconductor product according to the present disclosure. The exemplary embodiment 80 is similar to exemplary embodiment 50A of FIG. 5A, but differs in that additional stripe regions 84 are provided on the base region 81. In a further developed example, each of the additional stripe regions 84 may, instead of extending parallel with the stripe regions 82, zigzag from one stripe region 82 to a neighbouring stripe region 82 in a zigzag or serpentine pattern, or in any other workable pattern.

Note that the reference number 84 of the additional stripe regions 84 in FIG. 8 is not intended to correspond with the reference number 34 of the metal layer 34 in FIG. 3, since these elements are different, but that these numbers were simply chosen for reasons of convenience.

SiC MPS (Merged PIN Schottky) diodes feature large P+ regions/islands, which may be termed cell regions, that are embedded in the SiC epilayer, which may be termed a base region. This adds bipolar conduction capabilities to the JBS (Junction Barrier Schottky) structure. During a surge current event, the PN junctions formed by the large P+ regions can be turned on and help to reduce significantly voltage drop and power dissipation. This happens when the voltage drop generated by the Schottky current reaches 2.7-2.8 V needed to completely shrink the depleted region around the PN junctions allowing the bipolar current flow in the diode.

In an optimized design the large P+ islands (i.e. the cell regions) are connected to the device edges through thinner P+ layers, also known as current spread layers, and which may also be termed stripe regions. These stripe regions or spread layers are intended to spread the bipolar current from P+ islands (i.e. cell regions) to the other parts of the semiconductor product during the surge pulse.

As the P+ islands (i.e. the cell regions) are activated by the Schottky current flow, the use of the current spread layers (i.e. the stripe regions) helps to minimize the risks of electro-thermal runaway due to small local imbalance of current or temperature generated by inhomogeneities of the Schottky barrier height in some specific areas of the semiconductor product.

The IFSM performance of a SiC MPS diode is primarily determined by the PN to Schottky area ratio in the diode's active area. However, the size and distribution of the large area P+ islands (i.e. the cell regions) and P+ current spread layer (i.e. the stripe regions) may play a role in improving surge current capability. More particularly, ideally, the large area P+ islands (i.e. the cell regions) distributed in the cell field must be as large as possible to increase the uniformity of the Schottky current distribution in their neighborhood, allowing their activation at the lowest possible forward voltage value. On the other hand, the P+ current spread layers (i.e. the stripe regions) must be as thin as possible in order to compensate the reduction of the Schottky area (with consequent increase of the voltage drop), due to the partial pinch-off of the N-doped Schottky channels caused by the depleted region around the P+ layers. These needs put some constraints in terms of manufacturability and final fabrication costs on the semiconductor product.

At least some embodiments according to the present disclosure feature interdigitated P+ stripe regions connecting top and bottom edges of the diode with the function of main bipolar current spread layers with large area P+ islands (i.e. cell regions) connecting adjacent P+ stripe regions and distributed in the cell field. The width and pitch between contiguous P+ stripe regions are preferably constant and may be e.g. from 2 um to 4 um and from 1 um to 10 um, respectively.

To increase the uniformity of the Schottky current distribution around the large area P+ regions (i.e. the cell regions) and consequently allow their early activation, the P+ islands/cell regions connecting neighbouring stripe regions may have continuous or segmented shapes. Moreover, their shape may be concave, convex, or partly concave and partly convex, as is shown in the embodiments in FIGS. 5A-5G, or any combination of these, as is shown in the embodiment of FIG. 6.

With reference to the exemplary embodiments shown in FIGS. 5A-5G, each P+ island (i.e. cell region) is connected at least on one side to another P+ island (i.e. cell region) and not fully surrounded by a Schottky element as in prior art in FIG. 1. Moreover, two adjacent P+ islands (i.e. cell regions) are connected to larger straight P+ current spread layers (i.e. stripe regions), for example at least 2 um wide, connecting the top and bottom side of the semiconductor product.

The creation of a large area P+ doped region generated by shorting the single P+ islands (i.e. cell regions) makes more effective the functionality of the PN junction in increasing the bipolar current flow in the surge regime. The higher uniformity of the Schottky current distribution around larger P+ cell regions is such to activate them at an early voltage, increasing the surge current capability of the diode. Advantageously, this makes may aid application compatibility of at least some embodiments according to the present disclosure with the use of an interdigitated design for the P+ current spread layers (i.e. stripe regions) with larger width with respect to that used in the prior art serpentine shape P+ current spread layers in FIG. 1.

In the prior art, the longer length of the P+ layer provided by the serpentine shape is used to compensate for the lower efficiency of the isolated P+ doped hexagons while the thinner width of the P+ layers is used to minimize the pinching of the Schottky area between contiguous P+ regions, leading to an increase of the voltage drop and power loss.

In contrast, at least some embodiments according to the present disclosure may provide at least some of the following advantages:

1. Design flexibility. The P+ current spread layer (i.e. stripe regions) interdigitated design is compatible with the use of P+ cell regions having different shape and size. They can be suitably distributed in the interdigitated frame, potentially leading to further advantages in terms of enhanced surge current capability or uniformity of the bipolar current flow in the diode's cell field;

2. Manufacturability and fabrication costs. The use of larger P+ current spread layers (i.e. stripe regions) makes less critical the definition and alignment of the P+ metal contact layer inside, usually implemented through a self-aligned process. This makes these embodiments compatible with low-cost fabrication processes not necessarily requiring state of the art manufacturing/photolithography equipment.

3. Control of the diode's electrical performance. In these embodiments, it is much easier to control the repeatability of the diode's electrical characteristics due to the lack of any critical design features for the diode's manufacturability (e.g. straight P+ stripe regions, large P+ stripe regions' width and pitch).

At least some embodiments according to the present disclosure are such that P+ islands/cell regions with different size and/or shape are added to the interdigitated design frame, even with a non-uniform distribution, without modifying the semiconductor product's electrical characteristics in the low forward voltage regime determined by the constant pitch between neighbouring P+ interdigitated stripe regions. As shown in FIG. 7, the P+ islands can be aligned or staggered. They can also be distributed with higher density in the center of the active area in order to avoid higher bipolar current flowing at the diode's border, as shown in FIG. 4. At very high currents, the bipolar conduction tends to be enabled earlier at the diode perimeter because of the higher voltage drop due to the higher current density and because of the higher temperature due to self-heating effects. Thermal runaway on limited diode regions can cause the formation of hot spots with temperatures ultimately reaching high values up to the material melting point, leading to a premature failure of the device or thermo-mechanical stresses leading to cracks in the die.

Finally, at least some embodiments according to the present disclosure are also compatible with the integration of secondary thinner current spread layers (i.e. additional stripe regions) having the function to further distribute the bipolar current throughout the whole diode's cell field, with consequent improvement of the diode's surge current capabilities. These additional P+ spread layers may e.g. have a width between 1 um and 2 um and may be parallel to the main P+ stripes, as for example shown in the exemplary embodiment of FIG. 8, or may connect neighbouring P+ stripes.

Figure 9:
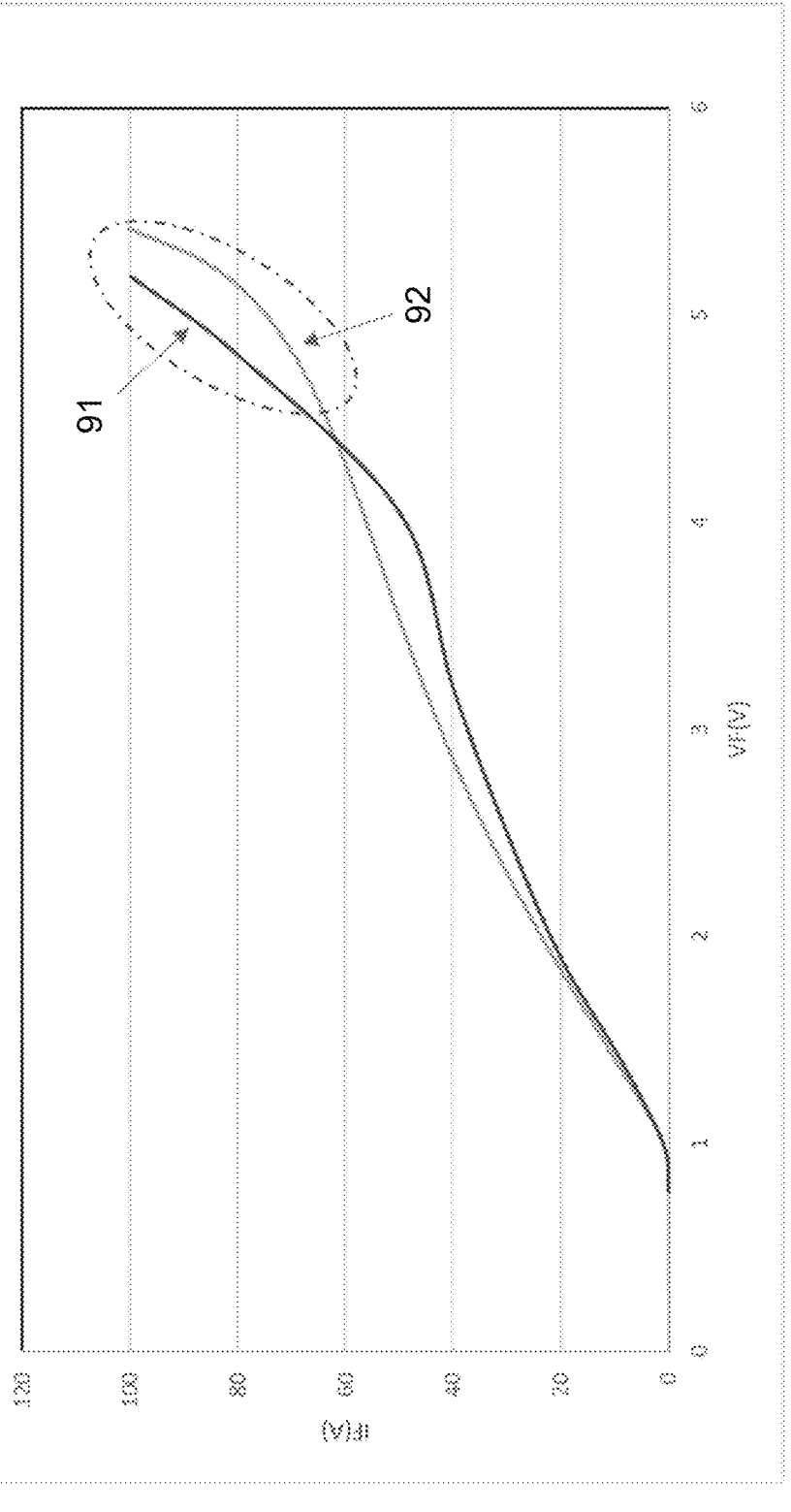
FIG. 9 shows a graph depicting a comparison of an embodiment of a semiconductor product according to the present disclosure to a prior art semiconductor product as described with respect to FIG. 1.

FIG. 9 shows a graph depicting a comparison of an embodiment 91 of a semiconductor product according to the present disclosure to a prior art semiconductor product 92 as was described above with respect to FIG. 1. The graph plots forward current IF in amperes A on the vertical axis as a function of forward voltage VF in volts V on the horizontal axis. As can be seen from the graph, in the indicated region, the embodiment 91 according to the present disclosure operates at an identical voltage for a significantly higher current compared to the prior art product 92. The graph shows the balance effect afforded by the present disclosure.

The surge current capability performance of an MPS diode may also be determined by device fabrication with main reference to the P+ region implantation and P+ ohmic contact process. It may be desirable to reduce the P+ contact resistance and bipolar current recombination in the P+ implanted region in order to enhance the diode's IFSM. Below are provided some exemplary process details of a method for producing a semiconductor product according to the present disclosure, allowing to reach state-of-the art IFSM performance in combination to the layout solutions described above. It is noted that these process details are merely example steps of the method for producing a semiconductor product according to the present disclosure, and that other process details may be used instead or additionally.

1. P$^+$ contact is a metal silicide (preferably NiSi).
2. Metal silicidation carried out through a rapid thermal annealing process with temperature between 900 C<T<1100 C and annealing time longer than 30 s.
3. P$^+$ implanted doping is at least $10^{20}$ cm$^{-3}$ with depth between 0.1 μm and 0.3 μm (preferably 0.2 μm) generated by multiple implant processes with energies between 30 and 300 KeV, and fluences ranging from $10^{13}$ cm$^{-2}$ to $10^{15}$ cm$^{-2}$.
4. P$^+$ implant is carried out at a temperature higher than 500 C.
5. P$^+$ implant activation is carried out at a temperature lower than 1750 C with a duration between 30 min and 1 hour.
6. A second annealing process at lower temperature can be carried out at a temperature lower than 1550 C and duration longer than 1 hour for implant damage recovery.
7. A sacrificial oxide thickness lower than 0.1 μm is grown and then removed from the SiC surface after the high temperature annealing process for defects removal.

With reference to certain embodiments of the semiconductor product according to the present disclosure, it is noted that, since the plurality of cell regions is provided on the upper surface of the base region, the definition therefore implies that they are not embedded within the stripe regions. Of course, the skilled person will understand that any "clump" of a stripe region may be abstractly delineated and termed a cell region, without departing from the underlying insights of the present disclosure. In other words, even if stripe regions are arranged on the base region and cell regions are arranged on the stripe regions and partly on the base region, this is still intended to be within the scope of the present disclosure. Likewise, if the cell regions are arranged first on the base region and are afterwards connected with piecewise stripe regions, this is still intended to be within the scope of the present disclosure.

In this context, the notion of providing an element on an upper surface of another element may be taken to mean that the element is deposited onto or even embedded into the other element, wherein the embedding is such that upper surface of the embedded element is still accessible and is not or is not entirely covered by the upper surface of the other element.

The disclosure is not limited to the examples shown in the present disclosure, but it also extends to other preferred variants that fall within the scope of the appended claims. Although the disclosure has been described and illustrated in exemplary forms with a certain degree of particularity, it is noted that the description and drawings have been made by way of example only. Numerous changes in the details of construction and combination and arrangement of parts and steps may be made. Accordingly, such changes are intended to be included in the present disclosure, the scope of which is defined by the claims.

Except to the extent explicitly stated or inherent within the processes described, including any optional steps or components thereof, no required order, sequence, or combination is intended or implied. As will be understood by the skilled person, with respect to both processes and any systems, devices, etc., described herein, a wide range of variations is possible, and even advantageous, in various circumstances, without departing from the scope of the disclosure, which is to be limited only by the claims.

LIST OF ELEMENTS IN THE DRAWINGS 20, 30, 40, 50A-50F, 60, 70, 80: exemplary embodiments of the semiconductor product according to the present disclosure.
21, 31, 51, 61, 71, 81: base region.
22, 32, 52, 62, 72, 82: stripe region.
23, 33, 53, 63A-63C, 73, 83: cell region.
34: metal layer.
84: additional stripe region.
91, 92: plotted functions of IF[A] as functions of VF[V].

What is claimed is:

1. A semiconductor product, comprising:
a base region doped with a first conductivity type;
a plurality of stripe regions doped with a second conductivity type, provided on an upper surface of the base region, wherein the second conductivity type is different from the first conductivity type;
a plurality of cell regions doped with the second conductivity type, provided on the upper surface of the base region; and
a metal layer arranged on the upper surface of the base region, so that the metal layer defines a Schottky barrier with the base region and covers the plurality of stripe regions and the plurality of cell regions;
wherein each cell region of a majority of the plurality of cell regions contacts at least one neighboring stripe region of the plurality of stripe regions; and
wherein the plurality of stripe regions and the plurality of cell regions have respective depths that extend into the base region that are different.

2. The semiconductor product of claim 1, wherein each cell region of the majority of the plurality of cell regions contacts at least two neighboring stripe regions of the plurality of stripe regions.

3. The semiconductor product of claim 1, wherein each cell region of the plurality of cell regions contacts at least one neighboring stripe region of the plurality of stripe regions.

4. The semiconductor product of claim 1, wherein each cell region of the plurality of cell regions contacts at least two neighboring stripe regions of the plurality of stripe regions.

5. The semiconductor product of claim 1, wherein the plurality of cell regions have individual cell regions that are aligned with at least some other cell region of the plurality of cell regions.

6. The semiconductor product of claim 1, wherein the plurality of cell regions have individual cell regions that are staggered with at least some other cell regions of the plurality of cell regions.

7. The semiconductor product of claim 1, wherein the plurality of stripe regions extends from one end of the semiconductor product to another end of the semiconductor product.

8. The semiconductor product of claim 1, wherein the base region is n-doped, and wherein the plurality of stripe regions and the plurality of cell regions are p-doped.

9. The semiconductor product of claim 2, wherein each cell region of the plurality of cell regions contacts at least one neighboring stripe region of the plurality of stripe regions.

10. The semiconductor product of claim 2, wherein each cell region of the plurality of cell regions contacts at least two neighboring stripe regions of the plurality of stripe regions.

11. The semiconductor product of claim 2, wherein the plurality of cell regions have individual cell regions that are aligned with at least some other cell regions of the plurality of cell regions.

12. The semiconductor product of claim 2, wherein the plurality of cell regions have individual cell regions that are staggered with at least some other cell regions of the plurality of cell regions.

13. A mask for producing a semiconductor product according to claim 1.

14. A method for producing a semiconductor product, the method comprising:

arranging a base region doped with a first conductivity type;

providing on an upper surface of the base region a plurality of stripe regions doped with a second conductivity type different from the first conductivity type;

providing on the upper surface of the base region a plurality of cell regions doped with the second conductivity type;

arranging a metal layer on the upper surface of the base region, so that the metal layer defines a Schottky barrier with the base region and covers the plurality of stripe regions and the plurality of cell regions;

wherein each cell region of a majority of the plurality of cell regions contacts at least one neighboring stripe region of the plurality of stripe regions; and wherein the plurality of stripe regions and the plurality of cell regions have respective depths that extend into the base region that are different.

15. The method of claim 14, wherein each cell region of the majority of the plurality of cell regions contacts at least two neighboring stripe regions of the plurality of stripe regions.

16. The method of claim 14, wherein each cell region of the plurality of cell regions contacts at least one neighboring stripe region of the plurality of stripe regions.

17. The method of claim 14, wherein the plurality of cell regions have individual cell regions that are aligned with at least some other cell regions of the plurality of cell regions, and/or wherein the plurality of cell regions have individual cell regions that are staggered with at least some other cell regions of the plurality of cell regions.

18. The method of claim 14, wherein each cell region of the plurality of cell regions contacts at least two neighboring stripe regions of the plurality of stripe regions.

19. A computer implemented method embodied on a non-transitory computer readable medium comprising instructions configured to cause a lithographic apparatus to perform the steps of the method of claim 14, when executed by a processor of the lithographic apparatus.

* * * * *